(12) United States Patent
Sakai et al.

(10) Patent No.: US 9,124,012 B2
(45) Date of Patent: Sep. 1, 2015

(54) BELLOWS BODY CONTACTOR HAVING A FIXED TOUCH PIECE

(75) Inventors: Takahiro Sakai, Moriyama (JP);
Yoshinobu Hemmi, Otsu (JP)

(73) Assignee: OMRON CORPORATION, Kyoto (JP)

( * ) Notice: Subject to any disclaimer, the term of this patent is extended or adjusted under 35 U.S.C. 154(b) by 0 days.

(21) Appl. No.: 14/342,532

(22) PCT Filed: Mar. 15, 2012

(86) PCT No.: PCT/JP2012/056657
§ 371 (c)(1),
(2), (4) Date: Mar. 3, 2014

(87) PCT Pub. No.: WO2013/054557
PCT Pub. Date: Apr. 18, 2013

(65) Prior Publication Data
US 2014/0227912 A1 Aug. 14, 2014

(30) Foreign Application Priority Data
Oct. 14, 2011 (JP) ................................ 2011-227172

(51) Int. Cl.
*H01R 13/24* (2006.01)
*G01R 1/067* (2006.01)
(52) U.S. Cl.
CPC ........ *H01R 13/2428* (2013.01); *G01R 1/06722* (2013.01); *G01R 1/06733* (2013.01); *H01R 13/24* (2013.01); *H01R 2201/20* (2013.01)
(58) Field of Classification Search
USPC ........................................... 439/824, 700, 66
See application file for complete search history.

(56) References Cited

U.S. PATENT DOCUMENTS

| 3,134,954 | A * | 5/1964 | Braun .............................. 338/66 |
| 6,464,511 | B1 * | 10/2002 | Watanabe et al. ................ 439/66 |
| 7,150,658 | B1 * | 12/2006 | Chien ............................ 439/700 |
| 2006/0020615 | A1 * | 1/2006 | Keohane et al. ............... 707/101 |
| 2009/0111289 | A1 * | 4/2009 | Vinther ........................... 439/66 |
| 2014/0218062 | A1 * | 8/2014 | Sakai et al. .............. 324/755.04 |
| 2014/0225638 | A1 * | 8/2014 | Sakai et al. .............. 324/755.04 |
| 2014/0227912 | A1 * | 8/2014 | Sakai et al. .................. 439/700 |

FOREIGN PATENT DOCUMENTS

| JP | S5537787 A | 3/1980 |
| JP | 10125428 | 5/1998 |
| JP | 2002008760 | 1/2002 |
| JP | 2002134202 A | 5/2002 |
| JP | 2002164135 | 6/2002 |
| JP | 2003307525 A | 10/2003 |

(Continued)

OTHER PUBLICATIONS

International Search Report for corresponding application PCT/JP2012/056658 filed Mar. 15, 2012; Mail date Jun. 5, 2012.

(Continued)

*Primary Examiner* — Chandrika Prasad
(74) *Attorney, Agent, or Firm* — Shinjyu Global IP

(57) ABSTRACT

A contactor including a bellows body, a fixed portion connected to one end of the bellows body, and a movable portion, connected to the other end of the bellows body, where the movable portion is configured to be depressed to compress the bellows body and to bring a connecting projection, projectingly provided on the bellow body, into contact with the bellows body itself.

18 Claims, 5 Drawing Sheets

(56) References Cited

FOREIGN PATENT DOCUMENTS

| | | |
|---|---|---|
| JP | 2004138391 | 5/2004 |
| JP | 3120893 U | 4/2006 |
| JP | 3122168 U | 6/2006 |
| JP | 2008047417 | 2/2008 |
| JP | 2009128218 | 6/2009 |
| JP | 2009146817 | 7/2009 |
| JP | 2011502339 | 1/2011 |
| JP | 2011146295 | 7/2011 |

OTHER PUBLICATIONS

International Search Report for corresponding application PCT/JP2012/056654 filed Mar. 15, 2012; Mail date Jun. 5, 2012.

International Search Report for corresponding application PCT/JP2012/056655 filed Mar. 15, 2012; Mail date Jun. 5, 2012.

International Search Report for corresponding application PCT/JP2012/056657 filed Mar. 15, 2012; Mail date Jun. 5, 2012.

* cited by examiner

BELLOWS BODY CONTACTOR HAVING A FIXED TOUCH PIECE

CROSS REFERENCE TO RELATED APPLICATION

This application is the United States National Phase of International Patent Application Number PCT/JP2012/056657 filed on 15 Mar. 2012 which claims priority to Japanese Patent Application No. 2011-227172 filed on 14 Oct. 2011, all of which said applications are herein incorporated by reference in their entirety.

TECHNICAL FIELD

The present invention relates to a contactor, and for example, relates to a contactor used for an integrated circuit inspection probe.

BACKGROUND ART

In the past, a contactor used for an integrated circuit inspection probe, has traditionally been a contactor of an electronic terminal receptacle, which holds contact between an electrode terminal of an electronic component and an electrode portion of a receptacle body by depressing the electronic component to the receptacle body, and which connects the electrode portion of the receptacle body to an electrode terminal of a connected electronic component. The electrode portion of the receptacle main body is formed by performing punching on an elastic plate material with a predetermined thickness, and has at both ends a pair of contacts respectively connected with the electrode terminal of the electronic component and the electrode terminal of the connected electronic component, while having a meandering portion successively installed in parallel and provided between the pair of contacts to connect the pair of contacts. Such configuration can be seen, for example, in Japanese Unexamined Patent Publication No. 2002-134202.

However, in the above contactor of the electronic terminal receptacle, the number of folds of the meandering portion is small and a desired displacement amount is thus difficult to ensure, which leads to lowered usability. For this reason, in order to ensure the desired displacement amount, a long contactor of the electronic terminal receptacle can be used where the number of folds has been increased. However, when the meandering portion of the long contactor becomes narrow, electric resistance increases to make it difficult for a current to flow and there are thus imposing problematic limits on lengthening of the contactor.

BRIEF SUMMARY

In view of the above problems, the invention provides a contactor having desired conductivity while ensuring a predetermined displacement amount.

A contactor is provided including a bellows body, a fixed portion connected to one end of the bellows body, and a movable portion, connected to the other end of the bellows body, where the movable portion is configured to be depressed to compress the bellows body and to bring a connecting projection, projectingly provided on the bellow body, into contact with the bellows body itself.

DETAILED DESCRIPTION

Embodiments of a contactor according to the present invention will be described in accordance with the accompanying drawing of FIGS. 1 to 4.

Figure 1:
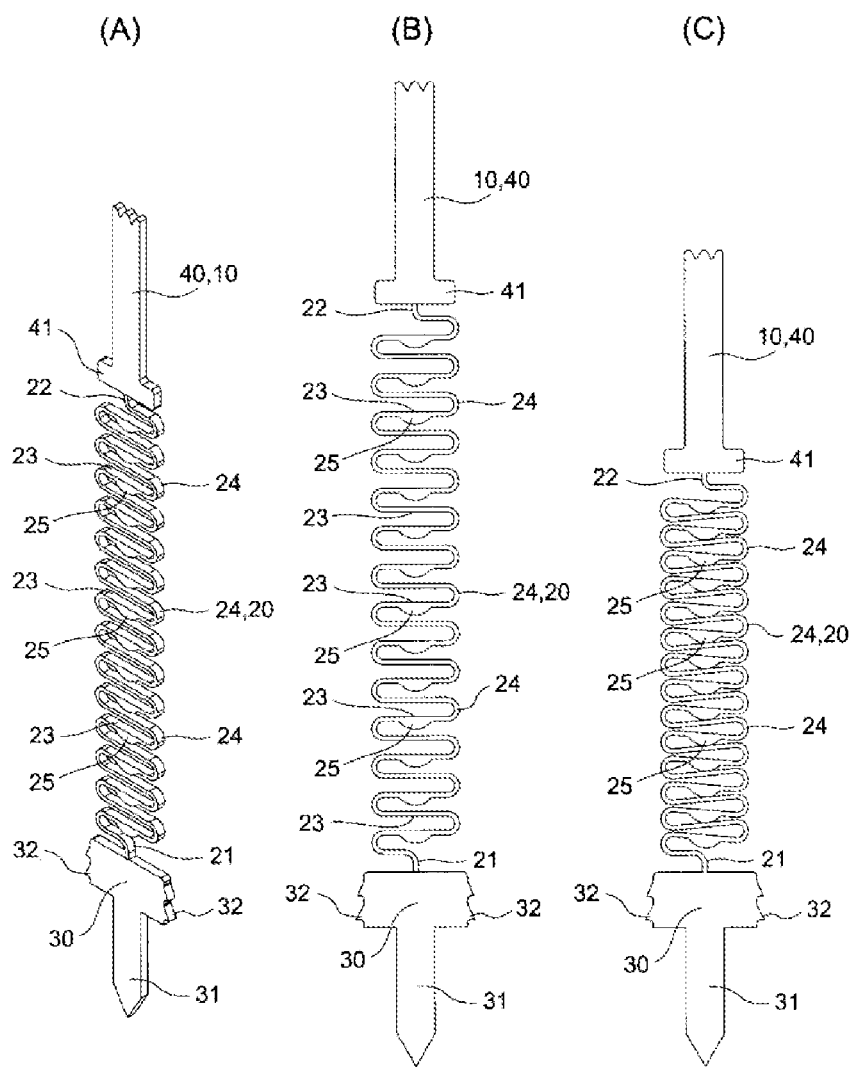
FIG. 1A is a perspective view showing a first embodiment of a contactor according to the present invention.
FIGS. 1B and 1C are front views respectively showing the contactor before and after an operation.
Figure 2:
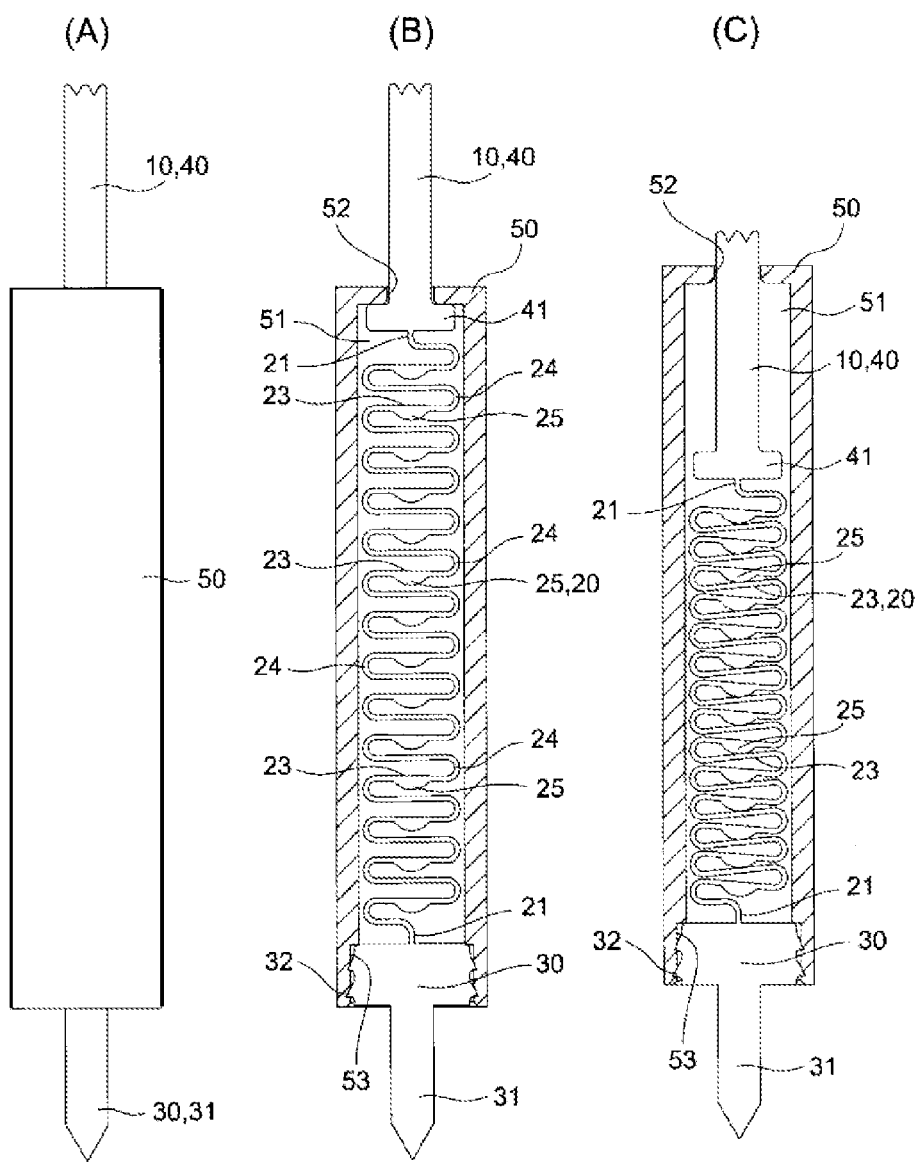
FIG. 2A is a front view of a state where the contactor shown in FIG. 1 has been housed inside a housing.
FIGS. 2B and 2C are front sectional views respectively showing the contactor before and after an operation.

A first embodiment is one in which, as shown in FIGS. 1 and 2, a contactor 10 is formed of a bellows body 20, a fixed portion 30 connected to one end 21 of the bellows body 20, and a movable portion 40 connected to the other end 22 of the bellows body 20. The contactor 10 is housed inside a housing 50.

The bellows body 20 is formed of linear-shaped intermediate portions 23, and arc portions 24 each connecting adjacent intermediate portions 23. Further, alternating intermediate portions 23 include a connecting projection 25 projecting therefrom. The bellows body 20 may have a cross section with an aspect ratio being not smaller than 1.5, preferably not smaller than 2, and may be formed by press working or by electroforming. It is to be noted that the aspect ratio here refers to a ratio between a thickness and a height of the cross section of the bellows body 20.

The one end 21 of the bellows body 20 is connected at a shaft center of the fixed portion 30 at the upper end thereof, and a terminal portion 31 is extended at the lower end of the fixed portion 30 along the shaft center. Further, a locking claw portion 32 is projectingly provided on each side surface of the fixed portion 30.

The movable portion 40 has a substantially T-shape on the front surface, and the other end 22 of the bellows body 20 is connected at the shaft center at a lower end of a large width portion 41 of the movable portion 40.

As shown in FIG. 2, the housing 50 has a rectangular-parallelepiped shape having a slit 51 where the contactor 10 can be housed, and the upper end surface of the housing 50 has an operation hole 52, while the lower end surface thereof has a press-fitting hole 53.

Then, as shown in FIG. 2, when the movable portion 40 is pressed down, the large width portion 41 descends by the bellows body 20 being compressed, and the connecting projections 25 come into contact with the intermediate portions 23 opposed thereto, to cause a short circuit. Further, when the movable portion 40 is pressed down, the adjacent arc portions 24 come into contact with each other to cause a short circuit. Hence the contact resistance decreases according to a displacement amount of the movable portion 40 and a current flows.

Figure 3:
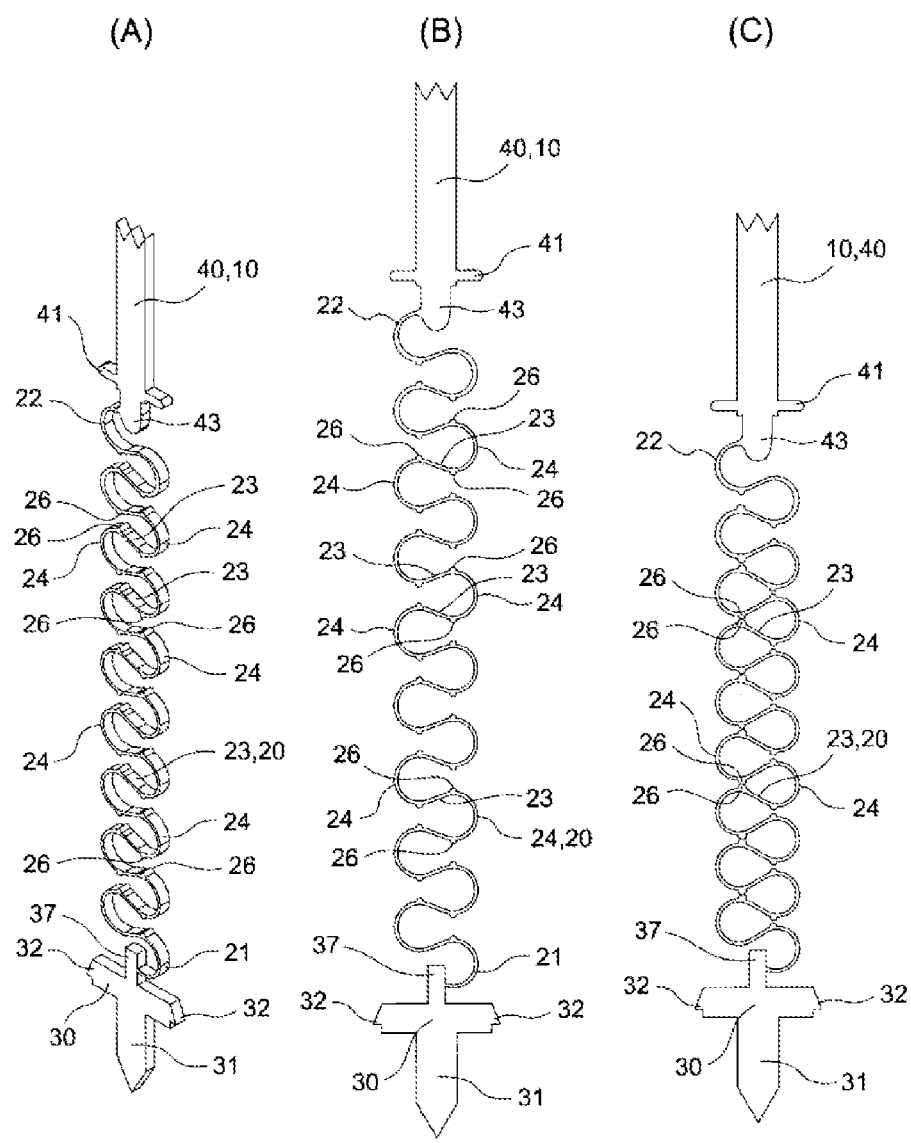
FIG. 3A is a perspective view showing a second embodiment of a contactor according to the present invention.
FIGS. 3B and 3C are front views respectively showing the contactor before and after the operation.
Figure 4:
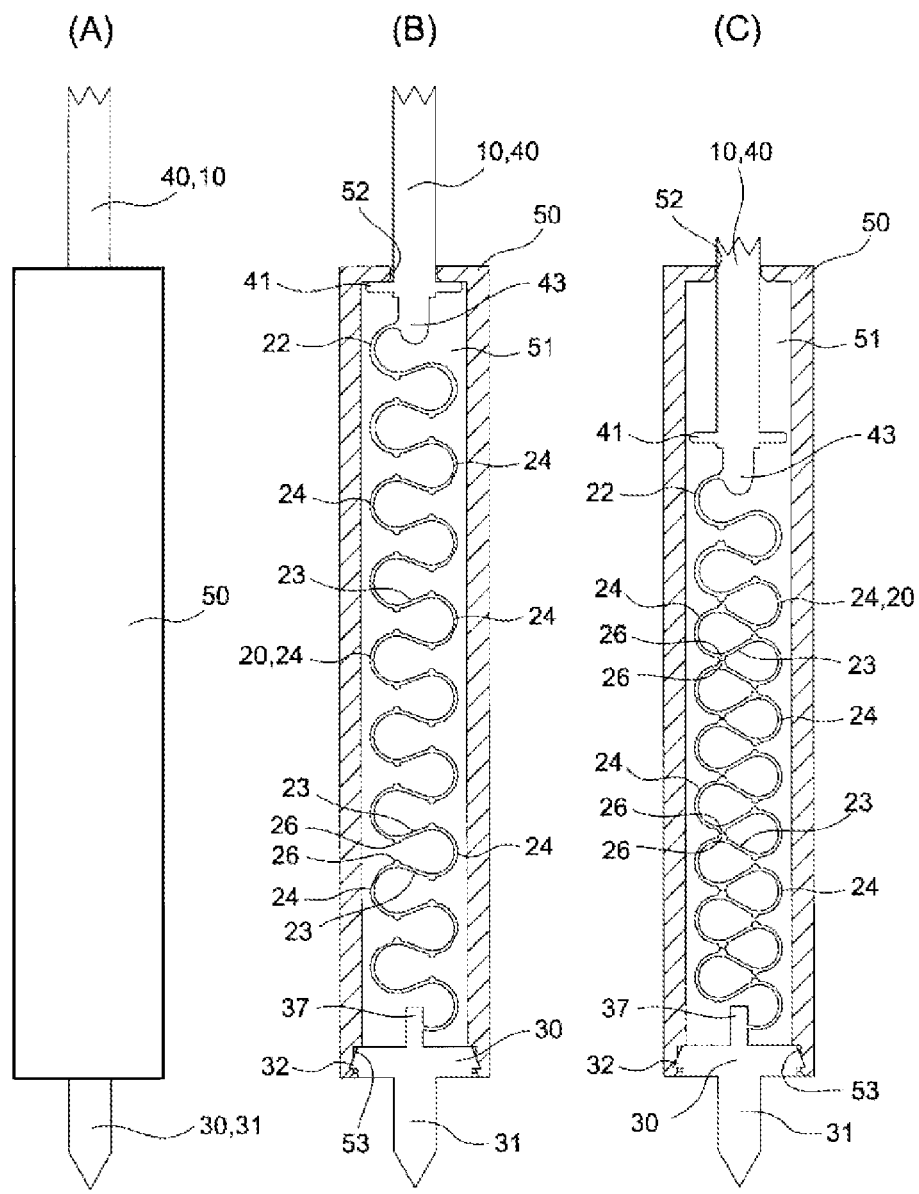
FIG. 4A is a front view of a state where the contactor shown in FIG. 3 has been housed inside a housing.
FIGS. 4B and 4C are front sectional views respectively showing the contactor before and after the operation.

As shown in FIGS. 3 and 4, a second embodiment is similar to the above first embodiment, where a contactor 10 is formed of a bellows body 20, a fixed portion 30 connected to one end 21 of the bellows body 20, and a movable portion 40 connected to the other end 22 of the bellows body 20. The contactor 10 is housed inside a housing 50.

The bellows body 20 is formed of curve-shaped intermediate portions 23, and arc portions 24 each connecting adjacent intermediate portions 23. The bellows body 20 further includes connecting projections 26, which can come into contact with each other, and are provided on each boundary between the intermediate portion 23 and the arc portion 24.

The one end 21 of the bellows body 20 is connected to a contacting shaft portion 37 projectingly provided at the shaft center of the fixed portion 30 on the upper end thereof, and a terminal portion 31 is extended along the shaft center at the lower end of the fixed portion 30. Further, a locking claw portion 32 is projectingly provided on each side surface of the fixed portion 30.

The movable portion 40 has a substantially T-shaped front surface, and the other end 22 of the bellows body 20 is connected to a contacting shaft portion 43 projectingly provided at the shaft center on the lower end of the large width portion 41 of the movable portion 40.

As shown in FIG. 4, the housing 50 has a rectangular-parallelepiped shape having a slit 51 where the contactor 10 can be housed, and the upper end surface of the housing 50 has an operation hole 52, while the lower end surface thereof has a press-fitting hole 53.

When the movable portion 40 is pressed down, the bellows body 20 is compressed and the connecting projections 26 come into contact with each other to cause a short circuit, whereby the contact resistance decreases and a current flows.

EXAMPLE 1

Figure 5:
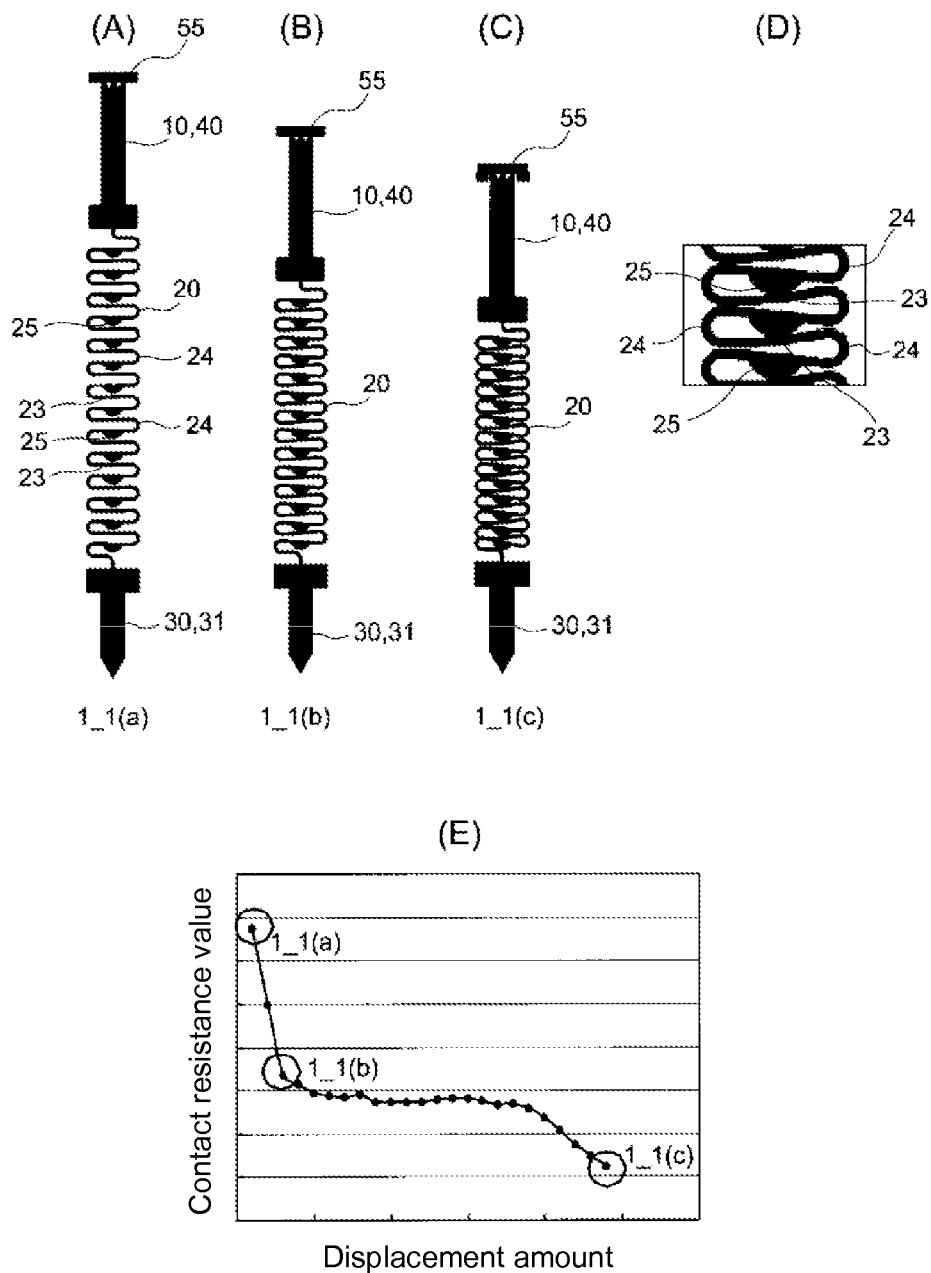
FIGS. 5A, 5B and 5C are front views showing an operating process of the first embodiment.
FIG. 5D is a partially enlarged view of FIG. 5C.
FIG. 5E is a graph showing results of measurement of the relation between a displacement amount and a contact resistance value.

The relation between the displacement amount and the contact resistance value of the contactor according to the first embodiment was measured. FIG. 5E graphically shows a result of the measurement.

As apparent from FIG. 5E, before the operation (FIG. 5A), the contact resistance value is large, and a current hardly flows.

When the movable portion 40 is pressed down with an operation body 55 (FIG. 5B), connecting projections 25 of the bellows body 20 come into contact with the intermediate portions 23 to cause a short circuit (FIG. 5D), whereby the contact resistance value abruptly decreases, and a current starts to flow.

Further, when the movable portion 40 is pressed down (FIG. 5C), the adjacent arc portions 24 of the bellows body 20 also come into contact with each other to cause a short circuit, and thereby the contact resistance gradually decreases and a current stably flows.

From the above example 1, it was found that the above contactor is not only usable as an integrated circuit inspection probe, but also usable as a switch, for example.

Especially when it is used as the integrated circuit inspection probe, since the above contactor can be formed with a small thickness, it is possible to arrange a large number of contactors at narrow pitches, while obtaining an integrated circuit inspection probe with a small number of components. Further, when it is used as a switch, a switch with good responsiveness can be obtained.

The contactor according to the present invention is not only usable as an integrated circuit inspection probe or a switch, but may also be used as a contact terminal of a battery.

Needless to say, the housing is not restricted to an integrally molded one, but may be one dividable into two parts.

As described, the contactor of one embodiment of the invention has a configuration where the movable portion is depressed to compress the bellows body and bring a connecting projection, projectingly provided on the bellow body, into contact with the bellows body itself. Accordingly, even if the bellows body is made long for the purpose of ensuring a desired displacement amount, when the bellows body is compressed, the connecting projection comes into contact with the bellows body itself to cause a short circuit, and hence it is possible to reduce contact resistance, so as to obtain a contactor with small contact resistance.

The bellows body may be made up of linear-shaped intermediate portions and arc portions each configured to connect the adjacent intermediate portions, and the connecting projection may be provided on at least one of the adjacent intermediate portions. Accordingly, when the bellows body is compressed, the connecting projection provided on the intermediate portion comes into contact with another intermediate portion opposed thereto, and hence it is possible to obtain a contactor with small contact resistance.

Alternatively, the bellows body may be made up of curve-shaped intermediate portions and arc portions each configured to connect the adjacent intermediate portions, and each of connecting projections configured to come into contact with each other may be provided on a boundary between the intermediate portion and the arc portion. Accordingly, when the bellows body is compressed, the connecting projections each provided on a boundary between the intermediate portion and the arc portion come into contact with each other, and hence it is possible to obtain a contactor with small contact resistance.

As discussed above, the connection between the bellows body and the fixed portion may be arranged at a shaft center of the fixed portion, or the connection may be arranged at an eccentric position relative to the shaft center of the fixed portion. Accordingly, when the connection between the bellows body and the fixed portion is arranged at the shaft center of the fixed portion, it is possible to obtain a contactor being operable by small force of operation and having a long life. When the connection between the bellows body and the fixed portion is arranged at an eccentric position relative to the shaft center of the fixed portion, the bellows body is apt to buckle, and hence it is possible to obtain a contactor with high contact pressure.

As described in detail above, a connection between the bellows body and the movable portion may be arranged at a shaft center of the movable portion, or the connection may be arranged at an eccentric position relative to the shaft center of the movable portion. Accordingly, when the connection between the bellows body and the movable portion is arranged at the shaft center of the movable portion, it is possible to obtain a contactor being operable by small force of operation and having a long life. When the connection is arranged at an eccentric position relative to the shaft center of the movable portion, the bellows body is apt to buckle, and there is thus an effect of being able to obtain a contactor with high contact pressure.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

The invention claimed is:

1. A contactor comprising:
   a bellows body;
   a fixed portion connected to one end of the bellows body;
   a movable portion, connected to the other end of the bellows body; and
   a connecting projection projectingly provided on the bellows body,
   wherein the movable portion is configured to be depressed to compress the bellows body and to bring the connecting projection, into contact with the bellows body itself,
   the bellows body is made up of linear-shaped intermediate portions and arc portions each connecting adjacent intermediate portions, and
   the connecting projection is provided on at least one of the adjacent linear-shaped intermediate portions.

2. The contactor according to claim 1, wherein the bellows body is connected to the fixed portion at a shaft center of the fixed portion.

3. The contactor according to claim 1, wherein the bellows body is connected to the fixed portion at an eccentric position relative to a shaft center of the fixed portion.

4. The contactor according to claim 1, wherein the bellows body is connected to the movable portion at a shaft center of the movable portion.

5. The contactor according to claim 1, wherein between the bellows body is connected to the movable portion at an eccentric position relative to a shaft center of the movable portion.

6. The contactor according to claim 2, wherein the bellows body is connected to the movable portion at a shaft center of the movable portion.

7. The contactor according to claim 3, wherein the bellows body is connected to the movable portion at a shaft center of the movable portion.

8. The contactor according to claim 2, wherein the bellows body is connected to the movable portion at an eccentric position relative to a shaft center of the movable portion.

9. The contactor according to claim 3, wherein the bellows body is connected to the movable portion at an eccentric position relative to a shaft center of the movable portion.

10. A contactor comprising:
    a bellows body;
    a fixed portion connected to one end of the bellows body;
    a movable portion, connected to the other end of the bellows body; and
    a connecting projection projectingly provided on the bellows body, wherein the movable portion is configured to be depressed to compress the bellows body and to bring the connecting projection, projectingly provided on the bellow body, into contact with the bellows body itself,
    the bellows body is made up of curve-shaped intermediate portions and arc portions connecting the adjacent intermediate portions, and
    a plurality of connecting projections are provided on opposed surfaces at a boundary between the intermediate portion and the arc portion,
    each of the connecting projections are configured to come into contact with each other when the movable portion is depressed to compress the bellows body.

11. The contactor according to claim 10, wherein the bellows body is connected to the fixed portion at a shaft center of the fixed portion.

12. The contactor according to claim 10, wherein the bellows body is connected to the fixed portion at a shaft center of the fixed portion.

13. The contactor according to claim 10, wherein the bellows body is connected to the fixed portion at an eccentric position relative to a shaft center of the fixed portion.

14. The contactor according to claim 10, wherein the bellows body is connected to the fixed portion at an eccentric position relative to a shaft center of the fixed portion.

15. The contactor according to claim 10, wherein the bellows body is connected to the movable portion at a shaft center of the movable portion.

16. The contactor according to claim 10, wherein the bellows body is connected to the movable portion at a shaft center of the movable portion.

17. The contactor according to claim 10, wherein the bellows body is connected to the movable portion at an eccentric position relative to a shaft center of the movable portion.

18. The contactor according to claim 10, wherein the bellows body is connected to the movable portion at an eccentric position relative to a shaft center of the movable portion.

* * * * *